United States Patent

Berlin

(10) Patent No.: US 7,646,205 B2
(45) Date of Patent: Jan. 12, 2010

(54) S-PARAMETER MEASUREMENT

(75) Inventor: Lennart Berlin, Gothenburg (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 394 days.

(21) Appl. No.: 11/720,995

(22) PCT Filed: Dec. 7, 2004

(86) PCT No.: PCT/SE2004/001824

§ 371 (c)(1),
(2), (4) Date: Jun. 6, 2007

(87) PCT Pub. No.: WO2006/062447

PCT Pub. Date: Jun. 15, 2006

(65) Prior Publication Data

US 2009/0267616 A1  Oct. 29, 2009

(51) Int. Cl.
*G01R 27/04* (2006.01)
(52) U.S. Cl. .................................. 324/638; 324/650
(58) Field of Classification Search ................. 324/638, 324/650
See application file for complete search history.

(56) References Cited

U.S. PATENT DOCUMENTS 4,349,789 A * 9/1982 Kurihara .................... 331/4
2004/0257092 A1* 12/2004 Verspecht ................ 324/638

\* cited by examiner

*Primary Examiner*—Vincent Q Nguyen

(57) ABSTRACT

The invention provides for a method of using a network analyzer and a test controller for measuring S-parameters of a device, which can assume a plurality of states, and which can switch very fast from one state to another. The test controller sends a trigger to the analyzer, which starts a frequency sweep when it receives this trigger. The frequency sweep, having substantially the same start and stop frequency, is provided to the device. The analyzer then executes a measurement of at least one S-parameter of the device, stores the S-parameter data from the measurement and provides the test controller with a trigger. The test controller then updates the device to the next state in a predetermined sequence of states when it receives the trigger from the analyzer. These steps are repeated until all states in the predetermined sequence of states have been measured. In addition, the invention provides for a system for measuring at least one S-parameter of a microwave device, which system comprises a test controller a network analyzer and the microwave device itself.

8 Claims, 3 Drawing Sheets

S-PARAMETER MEASUREMENT

FIELD OF THE INVENTION

The present invention relates to radio-frequency network analyzers. More specifically, the present invention relates to microwave vector network analyzers and a method and a system for an efficient measurement of parameters of microwave devices and similar, especially scattering parameters of two-port or multiport devices.

BACKGROUND OF THE INVENTION

Linear networks, or nonlinear networks operating with signals sufficiently small to cause the networks to respond in a linear manner, can be completely characterized by parameters measured at the network terminals (ports) without regard to the contents of the networks. Once the parameters of a network have been determined, its behavior in any external environment can be predicted, again without regard to the contents of the network.

Although a network may have any number of ports, network parameters can be explained most easily by considering a network with only two ports, an input port and an output port, like the network shown in FIG. 1.

To characterize the performance of such a network, any of several parameter sets can be used, each of which has certain advantages. Each parameter set is related to a set of four variables associated with the two-port model. Two of these variables represent the excitation of the network (independent variables), and the remaining two represent the response of the network to the excitation (dependent variables). If the network in FIG. 1 is excited by voltage sources V1 and V2, the network currents I1 and I2 will be related by any of the following equations:

| H-Parameters | Y-Parameters | Z-Parameters |
| --- | --- | --- |
| $V_1 = h_{11}I_1 + h_{12}V_2$ | $I_1 = y_{11}V_1 + y_{12}V_2$ | $V_1 = z_{11}I_1 + z_{12}I_2$ |
| $I_2 = h_{21}I_1 + h_{22}V_2$ | $I_2 = y_{21}V_1 + y_{22}V_2$ | $V_2 = z_{21}I_1 + z_{22}I_2$ |

The only difference in the parameter sets is the choice of independent and dependent variables. The parameters are the constants used to relate these variables.

The above H-parameters can be used as an explanatory example to clarify how parameter sets of this type can be determined through measurement. The parameter $h_{11}$ is determined by setting $V_2$ equal to zero, e.g. by applying a short circuit to the output port of the network. The parameter $h_{11}$ is then the ratio of $V_1$ to $I_1$, I.e. the input impedance of the resulting network. The parameter $h_{12}$ is in turn determined by measuring the ratio of $V_1$ to $V_2$ (I.e. the reverse voltage gain) having the input port open circuited. It is important to note that both open and short circuits are essential for obtaining the above-mentioned H-parameters, Y-parameters and Z-parameters.

However, the use of said H-, Y- and Z-parameters in connection with higher frequencies, especially in the microwave domain, present a problem since a short circuit looks like an inductor and an open circuit has some leakage capacitance. Active devices such as transistors and tunnel diodes are often instable if short or open circuited. In addition it is difficult to achieve short and open circuits over a broad band of frequencies, which is typically required. Moreover, it is difficult to measure total current or total voltage, which is required when using H-, Y-, or Z-parameters.

It is obvious that another method has to be used for characterizing these devices at high frequencies, especially microwave frequencies.

If we embed the exemplifying two-port device in FIG. 1 into a transmission line, and terminate the transmission line in its characteristic impedance $Z_L$, we can think of the stimulus signal provided by a generator having a impedance $Z_S$ that matches said characteristic impedance as a traveling wave incident on the device, and the response signal as a wave reflecting from the device or being transmitted through the device, see FIG. 2.

We can then establish this new set of equations relating these incident and "scattered" waves:

$$E_1 r = S_{11} E_1 i + S_{12} E_2 i \quad [1]$$

$$E_2 r = S_{21} E_1 i + S_{22} E_2 i \quad [2]$$

Wherein $E_{1r}$ and $E_{2r}$ are the dependent voltages reflected from the 1st and 2nd ports respectively, whereas $E_{1i}$ and $E_{2i}$ are the independent voltages incident upon the 1st and 2nd ports respectively.

Dividing the new set of equations by $Z_0$ (where $Z_0$ is the characteristic impedance of the transmission line) we can alter these equations to a more recognizable form:

$$b_1 = S_{11} a_1 + S_{12} a_2 \quad [3]$$

$$b_2 = S_{21} a_1 + S_{22} a_2 \quad [4]$$

Wherein $$b_n = \frac{E_{nr}}{\sqrt{Z_0}}, \text{ and} \quad [5]$$

$$a_n = \frac{E_{ni}}{\sqrt{Z_0}}; \quad [6]$$

and wherein:

$S_{11}$ is the input reflection coefficient equal to $b_1/a_1$ with $a_2=0$, i.e. no incident wave $E_{2i}$, which is accomplished by terminating the output of the two-port in an impedance equal to $Z_0$.

$S_{22}$ is the output reflection coefficient equal to $b_2/a_2$ with $a_1=0$, I.e. no incident wave $E_{1i}$, which is accomplished by terminating the input of the two-port in an impedance equal to $Z_0$.

$S_{21}$ is the forward transmission (insertion) gain equal to $b_2/a_1$ with $a_2=0$, I.e. no incident wave $E_{2i}$, which is accomplished by terminating the output of the two-port in an impedance equal to $Z_0$.

$S_{12}$ is the reverse transmission (insertion) gain equal to $b_1/a_2$ with $a_1=0$, i.e. no incident wave $E_{1i}$, which is accomplished by terminating the input of the two-port in an impedance equal to $Z_0$.

Where, for example:

$|b_1|^2$=Power reflected from the 1st port; and $|a_1|^2$=Power incident on the 1st port.

The above scattering parameters or S-parameters are determined with resistive termination, which obviates the difficulties involved in obtaining the broadband open and short circuit conditions required for the H-, Y-, and Z-parameters. Moreover, parasitic oscillations in active devices are minimized when the device is terminated in resistive loads. There is also standard equipment available for determining S-parameters since only incident wave $E_{ni}$ and reflected voltages need to be measured.

S-parameters are conveniently measured by means of modern professional microwave network analyzers, e.g. the Agilent E8362B vector network analyzer from Agilent Technologies Inc. with Head Quarters in Palo Alto, Calif., USA. S-parameters are measured by a modern microwave network analyzer substantially in the same way as indicated above, I.e. by providing a well-defined incident wave $E_{1i}$, $E_{2i}$ to the device under test and by measuring a possible reflected wave $E_{1r}$, $E_{2r}$ caused by the incident wave $E_{1i}$, $E_{2i}$. The conventional way to do this is to provide an incident wave $E_{1i}$, $E_{2i}$ with a frequency sweep that covers all the frequencies of interest for a certain state of a device under test, and then change the state of the device under test and provide a new frequency sweep.

However, the number of states that need to be measured tends to be very large when measuring a device that can assume several thousand of different states. An example of such a device is the transmit-and-receive modules (T/R-module) in radar equipments. Such T/R-modules can assume thousands of different states regarding phase and magnitude. Each such state affects the magnitude and/or phase of a signal that is transmitted or a signal that is received by the T/R-module.

The states in a T/R-module or a similar device under test can be changed very fast compared to changing the frequency in a network analyzer to accomplish a frequency sweep. Typically it takes milliseconds to change the frequency in a network analyzer and just 20-30 μs to change the state in the T/R-modules that are commonly measured today.

Moreover, it takes time to extract measured data from the microwave network analyzer to an external verification unit in setups comprising a verification unit. Every time communication is established there is also a certain amount of overhead. Depending on the type of instrument and the protocol used the total time for extracting data varies. In the Agilent E8362B the time is typically 30-100 milliseconds.

The time consumed during frequency change (10-20 ms for each frequency) and data retrieving with a microwave network analyzer (30-100 ms) is multiplied with the number of states that are to be measured. If a lot of states are to be measured this easily takes hours, e.g. when characterizing a T/R-module that may assume more than 600000 states. Such delays are clearly an inconvenience, particularly if a large number of T/R-modules or similar devices are to be characterized, which e.g. may be the case when developing and manufacturing such modules.

Consequently, there is a need for a method that gives a much faster measurement.

SUMMARY OF THE INVENTION

The invention provides for a method of using a microwave vector network analyzer and a test controller for measuring at least one S-parameter of a microwave device or similar, which device can assume a plurality of states, and which device can switch very fast from one state to another.

The measuring is achieved by a plurality of steps, which can be described in the following way: The test controller sends a trigger to the analyzer that. When the analyzer receives the trigger it will start a frequency sweep having substantially the same start and stop frequency. In the art a sweep with the same start and stop frequency is often called a zero frequency sweep or a zero span sweep. The frequency sweep is provided to the device under test. The analyzer then executes a measurement of at least one S-parameter of the device under test, stores the S-parameter data from the measurement and provides the test controller with a trigger. The test controller then updates the device under test to the next state in a predetermined sequence of states when it receives the trigger from the analyzer. These steps are repeated until all states in the predetermined sequence of states have been measured.

By configuring the analyzer to perform a zero frequency sweep or similar it will be possible to e.g. utilize the trigger function associated with a frequency sweep function in the analyzer without actually using any frequency sweep, I.e. without changing the frequency of the signal that is provided to the device. This makes it possible to automate the measuring performed by steps described above. The measuring of the states in a sequence of states according to the steps above is not delayed by any frequency change in the analyzer. The measuring is therefore very fast.

It is preferred that the S-parameter data obtained by the analyzer during the measurement sequence is transferred to the test controller when all states in the predetermined sequence have been measured.

It is also preferred that the S-parameter data is transferred to the test controller via a fast local area network (LAN).

In addition, the invention provides for a system for measuring at least one S-parameter of a microwave device or similar, which system comprises a test controller a network analyzer and the microwave device itself.

DETAILED DESCRIPTION OF REFERRED EMBODIMENTS

The present invention will now be described in more detail with reference to protected systems according to various embodiments of the invention.

Figure 3:
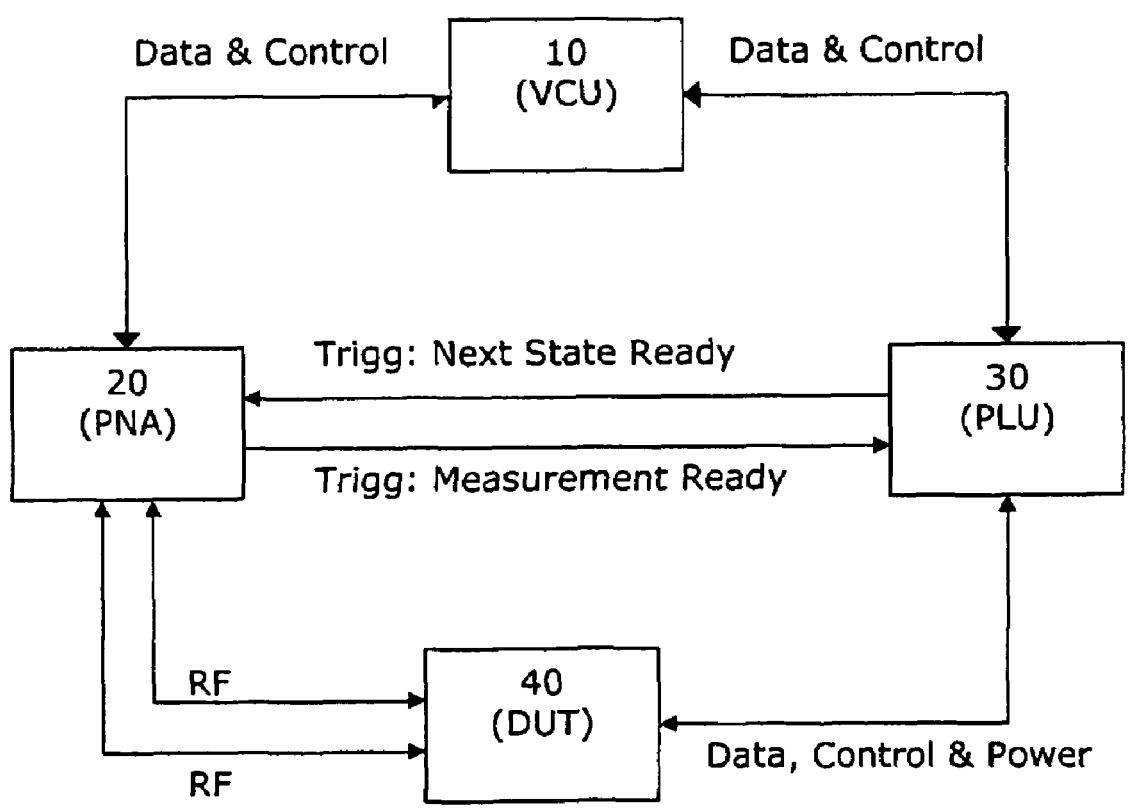
FIG. 3 shows an exemplifying measuring system 100 for measuring S-parameters according to an embodiment of the present invention.

FIG. 3 shows an exemplifying measuring system 100 for measuring S-parameters in a radio-frequency (RF) device according to a preferred embodiment of the present invention. The exemplifying system 100 comprises a verification unit 10, a microwave network analyzer 20, a power and logic unit 30 and a device under test 40.

The Units in the Measuring System

The verification unit 10 in FIG. 3 is preferably an ordinary personal computer (PC) that is generally available on the market, possibly with slight hardware modifications such as adding an I/O-card for facilitating the communication with peripheral equipment etc. It is also preferred that the PC is provided with software adapted for measuring and evaluation. Other verification units or similar are clearly possible, e.g. customized or dedicated verification units.

It is preferred that the verification unit 10 comprises a preprogrammed definition of the specific states that the device under test 40 shall assume during a measurement. In addition it is preferred that the verification unit 10 comprises a preprogrammed configuration of the measurement sequence that shall be performed during the measurement. The configuration of the measurement sequence may e.g. define the order in which the defined states shall be assumed by the device under test 40.

It is also preferred that the verification unit 10 comprises a preprogrammed configuration of the microwave network analyzer 20 that is to be used during a measurement. A typical configuration of a microwave network analyzer 20 includes such parameters as the S-parameter(s) to be measured, the frequency or frequencies of the incident wave(s) $E_{1i}$, $E_{2i}$, the power level of the incident wave(s) $E_{1i}$, $E_{2i}$, the trigger(s) that shall be used during the measurement, the number of measurements to be performed, etc. The configuration of a microwave network analyzer may differ between various analyzers and the configuration may also differ between various measuring setups. Hence, more parameters and other parameters may be needed to configure a specific microwave network analyzer 20.

If we now turn the attention to the microwave network analyzer 20 in FIG. 3 it is preferred that the analyzer is an Agilent E8362 microwave vector network analyzer or similar. However, the invention is not limited to an Agilent E8362. On the contrary, other analyzers with similar properties or at least suitable properties can be used. The analyzer may also cover other parts of the radio-frequency spectrum in addition to the microwave spectrum.

When it comes to the power and logic unit 30 in FIG. 3 it can be regarded as an interface between the verification unit 10 and the device under test 40. It is preferred that the power and logic unit 30 controls the device under test 40 according to instructions received from the verification unit 10. However, other embodiments of the invention may have a power and logic unit 30 that controls the device under test 40 in a more ore less autonomous manner, I.e. partly or fully without instructions from the verification unit 10. It is moreover preferred that the power and logic unit 30 provides the device under test 40 with the necessary electric power and similar that is required for a proper function of the device under test 40. The power and logic unit 30 can be a separate unit, or a unit that is partly arranged in the verification unit 10, or a unit that is fully arranged in the verification unit 10. The verification unit 10 and the power and logic unit 30 are identified as the test-controller 10, 30, when they are referred to as one single functional unit, which however may be implemented as several physical units.

As regards the microwave device under test 40 in FIG. 3 it is a two-port microwave device with an input port and an output port. However, other devices are clearly possible, e.g. a multi-port device or similar. The microwave device under test 40 can assume a large number of different states and the shift from one state to another can be executed very quickly, e.g. In the range of 10-20 μs. The device under test 40 may e.g. be a radar T/R-module that can assume thousands of different states of phase and magnitude, which states affect the magnitude and/or phase of a signal that is transmitted or a signal that is received by the T/R-module.

Connecting the Units

The verification unit 10 in FIG. 3 is connected to the power and logic unit 30 for enabling an exchange of data and control signals between the units 10, 30. The connection may e.g. be of any suitable kind that is commonly used to connect a personal computer (PC) to an external device.

The power and logic unit 30 in FIG. 3 is in turn connected to the device under test 40 for enabling an exchange of data, control signals and power etc. The connection is typically a customized or a dedicated connection that is adapted to enable a simple and efficient control of the device under test 40, e.g. enable the power and logic unit 30 to simply and quickly command the device under test 40 to change its state. It is also preferred that the connection in question provides the device under test 40 with the required power if needed.

The verification unit 10 in FIG. 3 is moreover connected to the microwave network analyzer 20 for enabling an exchange of information and control signals between the units 10, 40. The information is typically data that has been obtained by the microwave network analyzer 20 during a measurement of the device under test 40. Control signals are typically needed to establish each communication session between the units 10, 40. Headers and similar in the data packages or similar that are transferred from the microwave network analyzer 20 to the verification unit 10 may also be regarded as control signals. The amount of data that is transferred is typically large, which means that the transfer is time-consuming. The control signals add to this time. Depending on the type of microwave network analyzer 20 and the protocol used the total time for extracting data from the analyzer 20 varies. In the case of an Agilent E8362B the time for transfer a set of measured data to the verification unit 10 is typically 30-100 milliseconds. To minimize the amount of time for transferring data from the microwave network analyzer 20 to the verification unit 10 it is preferred that the verification unit 10 is connected to the microwave network analyzer 20 via a high-speed channel, e.g. a local area network (LAN), e.g. a network using Ethernet or similar. It is moreover preferred that the connection is a per-to-per connection, i.e. that no other device is using the high-speed connection, since this may cause delays in the case of congestions on the channel. It is also preferred that the data is transferred as directly as possible from the data storage in the microwave network analyzer 20 to the verification unit 10. This is preferably accomplished by a direct access to the hardware memory circuits in the network analyzer 20. In the case of an Agilent E8362B this can be achieved by utilizing the DCOM communication protocol.

The microwave network analyzer 20 in FIG. 3 is in turn connected to the device under test 40 via two microwave cables, e.g. two coaxial cables. One of the cables connects the microwave network analyzer 20 to the input port of the device under test 40 and the other cable connects the microwave network analyzer 20 to the output port of the device under test 40. Other connections are clearly possible, e.g. if only one port is to be measured or if the device under test 40 is a multi port device etc.

The microwave network analyzer 20 and the power and logic unit 30 are also connected to each other via two trigger channels. A first trigger channel enables the power and logic unit 30 to send a trigger to the microwave network analyzer 20 each time the setting of the device under test 40 has changed from one state to another, e.g. each time the power and logic unit 30 has commanded the device under test 40 to assume a new state with respect to phase and magnitude. This trigger has been schematically illustrated in FIG. 3 by a line with an arrow extending from the power and logic unit 30 to the microwave network analyzer 20. A second trigger channel enables the microwave network analyzer 20 to send a trigger to the power and logic unit 30 each time the microwave network analyzer 20 has performed a measurement. This trigger has been schematically illustrated in FIG. 3 by a line with an arrow extending from the microwave network analyzer 20 to the power and logic unit 30.

The Operation of the System

Figure 4:
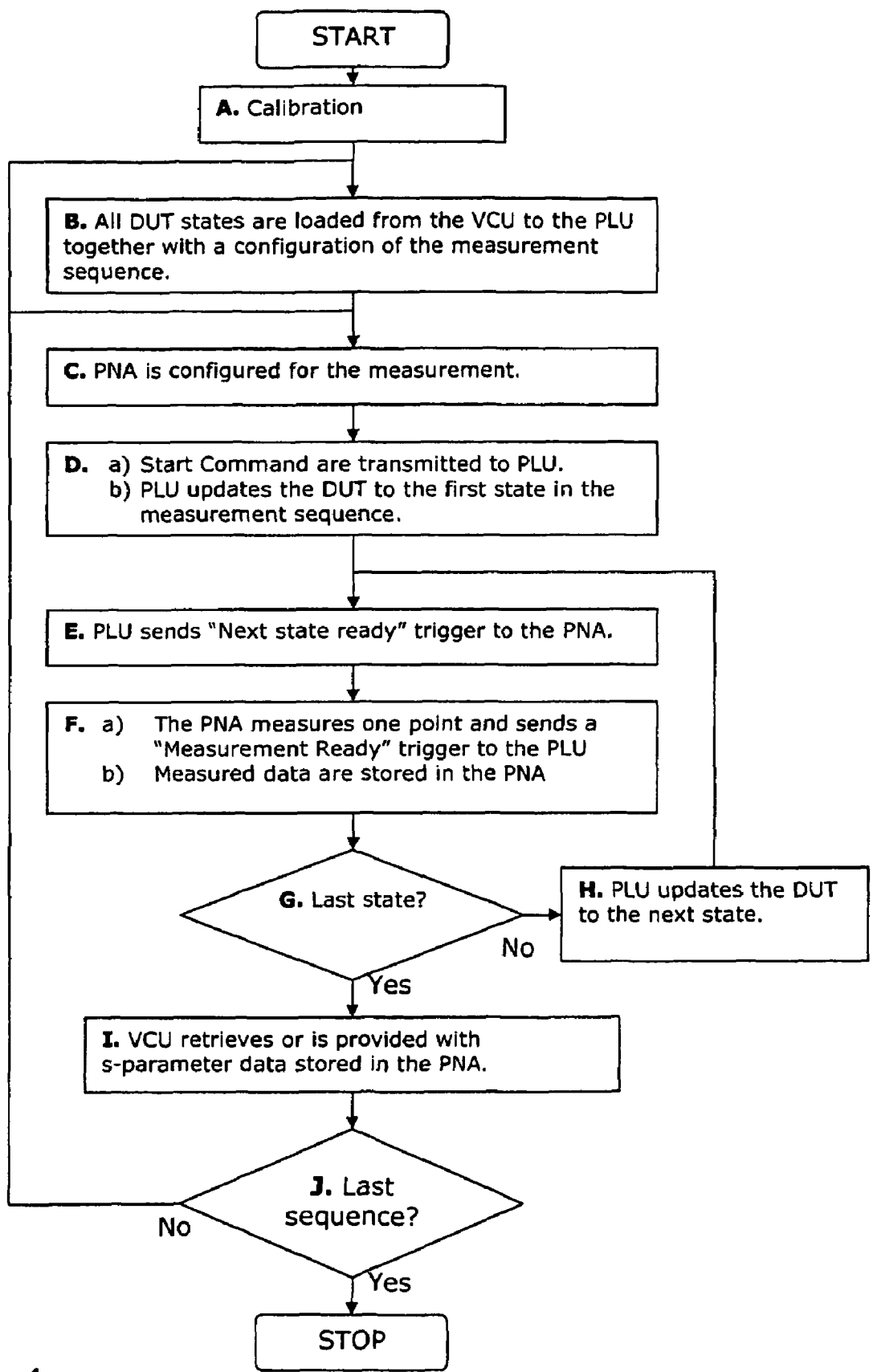
FIG. 4 shows an exemplifying flowchart of the measuring sequences that can be performed according to an embodiment of the present invention.

FIG. 4 shows an exemplifying flowchart of the measuring steps that is performed according to a preferred embodiment of the present invention.

The first step (A) is to calibrate the microwave network analyzer 20. The calibration is intended to eliminate the influence from the two microwave cables and possible other arrangements that connect the microwave network analyzer 20 to the device under test 40. The calibration may also include the internal calibration of the microwave network analyzer 20 and a possible calibration of other units in the measuring system 100.

The second step (B) is to load the power and logic unit 30. In this step it is preferred that the verification unit 10 provides the power and logic unit 30 with a number of preprogrammed states that the device under test 40 shall assume during the measurement. It is also preferred that the verification unit 10 provides the power and logic unit 30 with a preprogrammed configuration of the measurement sequence. The configuration of the measurement sequence may e.g. define the order in which the power and logic unit 30 shall command the device under test 40 to assume the preprogrammed states. The configuration of the measurement sequence may also define how many times the measurement sequence should be executed etc.

The third step (C) is to configure the microwave network analyzer 20. In this step it is preferred that the verification unit 10 provides the microwave network analyzer 20 with a preprogrammed configuration. However, it is also possible to have the microwave network analyzer 20 configured manually, e.g. via the keypad on the microwave network analyzer 20 or in some other suitable way.

The fourth step (D) is to initiate the measurement sequence as defined in step (B). It is preferred that the sequence is initiated by providing the power and logic unit 30 with a start signal or similar. A start signal may e.g. be provided manually or from the verification unit 10 or in some other suitable way. When the power and logic unit 30 receives the start signal it will command the device under test 40 to assume the first state in the measurement sequence.

The fifth step (E) is to initiate the microwave network analyzer 20. In this step it is preferred that the power and logic unit 30 provides the microwave network analyzer 20 with a "next state ready" trigger when the device under test 40 has assumed the state that was commanded by the power and logic unit 30 in the previous step. The trigger is preferably provided via the first trigger channel or similar as described above.

The sixth step (F) is to let the microwave network analyzer 20 measure one measurement point, store the measured S-parameter data and send a "measurement ready" trigger to the power and logic unit 30. The trigger is provided via the second trigger channel or similar as described above. The measurement is performed by letting the microwave network analyzer 20 provide an incident wave $E_{1i}$ or $E_{2i}$ of a predefined zero frequency sweep to the device under test 40 and send a trigger to the power and logic unit 30 when the measurement is completed. The zero frequency sweep has substantially the same start and stop frequency, I.e. the incident wave $E_{1i}$ or $E_{2i}$ has substantially one and the same frequency. In other words the microwave network analyzer 20 does not change the frequency of the incident wave $E_{1i}$ or $E_{2i}$ to cover any frequency interval. In an Agilent E8362B vector network analyzer this can be achieve by utilizing its "step-sweep mode".

There is consequently no delay due to frequency changes in the microwave network analyzer 20 before the next measuring step (i.e. step (G)) can be performed. Similarly, there is no delay due to frequency changes in the microwave network analyzer 20 before the device under test 40 can assume the next state (i.e. proceed from step (G) to step (H)).

It should be added that a measurement point consequently corresponds to a measurement of the S-parameter(s) for one state of the device under test 40 at one frequency for the incident wave $E_{1i}$ or $E_{2i}$. A measurement sequence comprises a plurality of such measurement points.

The number of states to be measured is preferably defined in the preprogrammed definition of the specific states that the device under test 40 shall assume, which definition is comprised by the verification unit 10 and provided to the power and logic unit 30 according to step (B) above. The number of measurement points to be measured by the microwave network analyzer 20 is preferably defined in the preprogrammed configuration that is provided to the microwave network analyzer 20 in step (C) above. The number of states should be equal to the number of measurement points.

The seventh step (G) is to check if the device under test 40 has assumed the last step in the measurement sequence. The power and logic unit 30 preferably performs the check.

The execution of the measuring steps will proceed to the eighth step (H), provided that the last step in the measurement sequence has not been reached. In this step it is preferred that the power and logic unit 30 updates the device under test 40 to assume the next step in the measurement sequence. The execution of the measuring steps will then proceed from the fifth step (E) and forward.

However, the execution of the measuring steps will proceed to the ninth step (I) if the last step in the measurement sequence has been reached. In this step it is preferred that verification unit 10 retrieves or is provided with the data from the measurement sequence that is stored in the microwave network analyzer 20. In other words, the S-parameter data that has been obtained by the microwave network analyzer 20 during a measurement sequence is transferred to the verification unit 10 when the measurement sequence is completed, I.e. no data is transferred after the individual measurement points or at any other instance in a proceeding measurement sequence. This saves time due to the reduced number of occasions when a communication has to be established between the verification unit 10 and the microwave network analyzer 20. It is preferred that the microwave network analyzer 20 is configured to provide the verification unit 10 with the S-parameter data when the last measurement point in the measurement sequence has been measured.

The tenth step (J) is to check if the last measurement sequence has been completed. As pointed out above, the configuration of a measurement sequence may e.g. define that a measurement sequence shall be executed a number of times. It is preferred that the power and logic unit 30 performs this check.

The execution of the measuring steps will proceed from step (B) or step (C) and forward if the last measurement sequence has not been completed. If the execution of the measuring steps proceeds from step (B) it will be possible to change the configuration of the measurement sequence and the states therein before the next measurement starts. It will also be possible to change the configuration of the microwave network analyzer 20, as the execution of the measuring steps will pass step (C). However, if the execution of the measuring steps proceeds from step (C) it will only be possible to change the configuration of the microwave network analyzer 20 before the next measurement starts.

However, the execution of the measuring steps will stop if the last measurement sequence has been completed.

It should be emphasized that the steps A-J described above is a preferred embodiment of the invention. Other embodiments may not use all these steps and/or may use additional step and/or alternatives to the steps A-J. It should also be emphasized that different embodiments of the invention may execute the measuring steps (e.g. step A-J) in a different sequence, i.e. the order in which the steps are executed may be changed without departing from the invention.

While the above description comprises exemplifying embodiments of the present invention, it will be appreciated that the invention is susceptible to modification, variation and change without departing from the proper scope or fair meaning of the accompanying claims.

REFERENCE SIGNS

100 Measuring system
10 Verification Unit (VCU)
20 Professional Microwave Network Analyzer (PNA)
30 Power and Logic Unit (PLU)
40 Device Under Test (DUT)

The invention claimed is:

1. A method of using a network analyzer and a test controller to measure at least one scattering parameter (S-parameter) of a device that rapidly switches through a plurality of states, said method comprising the steps of:
   (a) sending a first trigger from the test controller to the analyzer;
   (b) performing a frequency sweep of the device by the analyzer when the analyzer receives the first trigger from the test controller, said frequency sweep having substantially the same start and stop frequency;
   (c) measuring by the analyzer, at least one S-parameter of the device;
   (d) sending a second trigger from the analyzer to the test controller, said second trigger causing the test controller to step the device to a next state in a predefined sequence of states, if a next state exists; and
   (e) iteratively repeating steps (a) through (d) until S-parameters have been measured for all of the states in the predetermined sequence of states.

2. The method according to claim 1, wherein the step of measuring at least one S-parameter includes executing a vector measurement of at least one S-parameter of the device.

3. The method according to claim 1, further comprising transferring from the analyzer to the test controller, the measured S-parameters for all of the states in the predetermined sequence of states.

4. The method according to claim 3, wherein the measured S-parameters for all of the states in the predetermined sequence of states are transferred to the test controller via a local area network.

5. A system for measuring at least one scattering parameter (S-parameter) of a device that rapidly switches through a plurality of states, said system comprising:
   a test controller; and
   an analyzer in communication with the test controller;
   wherein the test controller is adapted to send a first trigger to the analyzer; and
   the analyzer is adapted to:
      perform a frequency sweep of the device in response to receiving the first trigger from the test controller, said frequency sweep having substantially the same start and stop frequency;
      measure at least one S-parameter of the device; and
      send a second trigger to the test controller, said second trigger causing the test controller to step the device to a next state in a predefined sequence of states, if a next state exists, and to send another trigger to the analyzer;
   wherein the test controller and analyzer are adapted to iteratively repeat S-parameter measurements for different states of the device until S-parameters have been measured for all of the states in the predetermined sequence of states.

6. The system according to claim 5, wherein the analyzer is adapted to execute a vector measurement of at least one S-parameter of the device.

7. The system according to claim 5, wherein the analyzer includes means for transferring to the test controller, the measured S-parameters for all of the states in the predetermined sequence of states.

8. The system according to claim 7, further comprising a local area network for transferring the measured S-parameters from the analyzer to the test controller.

* * * * *

UNITED STATES PATENT AND TRADEMARK OFFICE
CERTIFICATE OF CORRECTION

PATENT NO. : 7,646,205 B2 Page 1 of 2
APPLICATION NO. : 11/720995
DATED : January 12, 2010
INVENTOR(S) : Lennart Berlin It is certified that error appears in the above-identified patent and that said Letters Patent is hereby corrected as shown below:

On the Title Page, in item (57), under "ABSTRACT", in Column 2, Lines 1-18,
delete "The invention provides for a method of using a network analyzer and a test
controller for measuring S-parameters of a device, which can assume a plurality of states,
and which can switch very fast from one state to another. The test controller sends a trigger
to the analyzer, which starts a frequency sweep when it receives this trigger. The frequency
sweep, having substantially the same start and stop frequency, is provided to the device.
The analyzer then executes a measurement of at least one S-parameter of the device, stores
the S-parameter data from the measurement and provides the test controller with a trigger.
The test controller then updates the device to the next state in a predetermined sequence of
states when it receives the trigger from the analyzer. These steps are repeated until all
states in the predetermined sequence of states have been measured. In addition, the
invention provides for a system for measuring at least one S-parameter of a microwave
device, which system comprises a test controller a network analyzer and the microwave
device itself." and
insert -- A method and system utilizing a network analyzer and a test controller for
measuring scattering parameters (S-parameters) of a microwave device that rapidly
switches through a plurality of states. The test controller sends a trigger to the analyzer,
which starts a frequency sweep having substantially the same start and stop frequency, and
provides the sweep to the device. The analyzer then measures and stores at least one
S-parameter of the device and provides the test controller with a trigger. The test controller
updates the device to the next state in a predetermined sequence of states and the above
steps are iteratively repeated until S-parameters for all of the states in the sequence have
been measured. --, therefor.

Signed and Sealed this

Nineteenth Day of October, 2010

David J. Kappos
*Director of the United States Patent and Trademark Office*

CERTIFICATE OF CORRECTION (continued)
U.S. Pat. No. 7,646,205 B2

Figure 1:
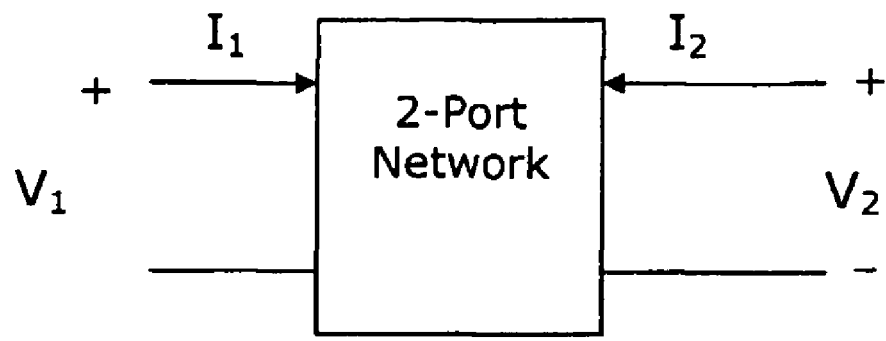
FIG. 1 shows a schematic illustration of a well-known two-port network having one input port and one output port.
Figure 2:
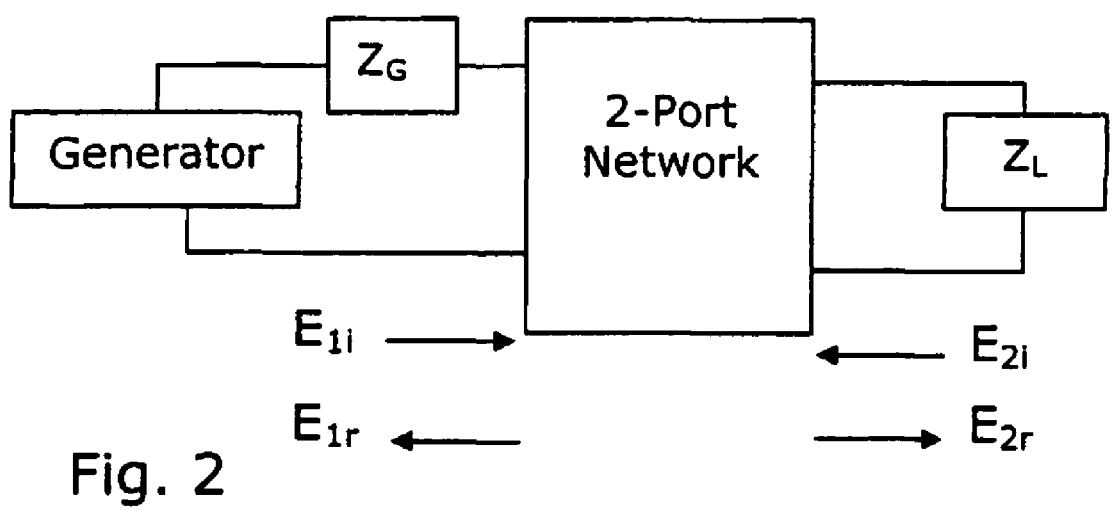
FIG. 2 shows the exemplifying two-port device in FIG. 1 embedded in a transmission line that is terminated in its characteristic impedance $Z_L$ at one end and connected at the other end to a generator with an impedance $Z_G$ that matches said characteristic impedance.

In Fig. 1, Sheet 1 of 3, delete " $V_1^+$ " and insert -- $\overline{V_1^+}$ --, therefor.

In Column 2, Line 15, in Equation [1], delete " $E_1r=S_{11}E_1i+S_{12}E_2i$ " and insert -- $E_{1r}=S_{11}E_{1i}+S_{12}E_{2i}$ --, therefor.

In Column 2, Line 17, in Equation [2], delete " $E_2r=S_{21}E_1i+S_{22}E_2i$ " and insert -- $E_{2r}=S_{21}E_{1i}+S_{22}E_{2i}$ --, therefor.

In Column 4, Line 46, delete "REFERRED" and insert -- PREFERRED --, therefor.